(12) United States Patent
Chen et al.

(10) Patent No.: US 10,104,794 B2
(45) Date of Patent: Oct. 16, 2018

(54) ELECTRONIC DEVICE AND METAL HOUSING THEREOF

(71) Applicant: Delta Electronics, Inc., Taoyuan (TW)

(72) Inventors: Hung-Chi Chen, Taoyuan (TW); Do Chen, Taoyuan (TW); Ching-Ho Chou, Taoyuan (TW); Shang-Yu Li, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/710,329

(22) Filed: Sep. 20, 2017

(65) Prior Publication Data

US 2018/0177063 A1     Jun. 21, 2018

(30) Foreign Application Priority Data

Dec. 15, 2016   (CN) .......................... 2016 1 1158504

(51) Int. Cl.
*H05K 5/00*   (2006.01)
*H05K 5/04*   (2006.01)

(52) U.S. Cl.
CPC ..................................... *H05K 5/04* (2013.01)

(58) Field of Classification Search
CPC .......... H02G 3/08; H02G 3/081; H02G 3/085; H02G 3/086; H05K 5/00; H05K 5/02; H05K 5/0004; H05K 5/0217; H05K 5/0247; H05K 5/04
USPC ... 174/50, 520, 17 R, 535, 559, 53, 51, 5 R; 220/3.2–3.9, 4.02; 439/535, 76.1, 76.2
See application file for complete search history.

(56) References Cited

U.S. PATENT DOCUMENTS

| | | | | |
|---|---|---|---|---|
| 3,816,638 A | * | 6/1974 | Appleton | H02G 3/085 174/51 |
| 4,438,859 A | * | 3/1984 | Solek | H02G 3/081 220/3.2 |
| 5,272,279 A | * | 12/1993 | Filshie | H05K 5/0008 174/50 |
| 6,894,222 B2 | * | 5/2005 | Lalancette | H02G 3/12 174/50 |
| 7,700,875 B2 | * | 4/2010 | Lalancette | H02G 3/086 174/50 |
| 7,825,336 B2 | * | 11/2010 | Peck | H02G 3/121 174/50 |
| 8,297,579 B1 | * | 10/2012 | Gretz | H02G 3/125 220/3.9 |
| 8,779,284 B2 | * | 7/2014 | Wagner | H02G 3/081 174/50 |

* cited by examiner

*Primary Examiner* — Angel R Estrada
(74) *Attorney, Agent, or Firm* — Muncy, Geissler, Olds & Lowe, P.C.

(57) ABSTRACT

A metal housing is provided. The metal housing includes a bottom plate, a first side plate, a second side plate, a third side plate, a fourth side plate, and a ground portion. The second side plate is parallel to the first plate. The fourth side plate is parallel to the third side plate. The first side plate, the second side plate, the third side plate, and the fourth side plate are integrally formed on the bottom plate. The ground portion is formed on an inner surface of one of the side plates. The ground portion includes a restriction structure and an opening. The restriction structure is integrally formed on the inner surface. The restriction structure is adapted to hold a ground line.

14 Claims, 6 Drawing Sheets

ELECTRONIC DEVICE AND METAL HOUSING THEREOF

CROSS REFERENCE TO RELATED APPLICATIONS

This Application claims priority of Chinese Patent Application No. 201611158504.1, filed on Dec. 15, 2016, the entirety of which is incorporated by reference herein.

BACKGROUND

Field of the Invention

The present invention relates to a metal housing, and in particular to a metal housing utilized in an electronic device.

Description of the Related Art

Conventional electronic devices include a metal housing and a circuit board. The circuit board is received in the metal housing. A conventional metal housing includes a bottom plate, a first side plate, a second side plate, a third side plate, and a fourth side plate. The first side plate and the second side plate are welded to the bottom plate, the third side plate, and the fourth side plate. The circuit board includes a ground line. The ground line is fastened to the metal housing by a screw. The structure of the conventional metal housing is complex, difficult to assemble, and expensive. During assembly of the conventional metal housing, manufacturing discrepancies may occur, and the reliability thereof is decreased.

SUMMARY

In one embodiment, a metal housing is provided. The metal housing includes a bottom plate, a first side plate, a second side plate, a third side plate, a fourth side plate and a ground portion. The second side plate is parallel to the first plate. The fourth side plate is parallel to the third side plate. The first side plate, the second side plate, the third side plate, and the fourth side plate are integrally formed on the bottom plate. The ground portion is formed on an inner surface of one of the side plates. The around portion includes a restriction structure and an opening. The restriction structure is integrally formed on the inner surface. The restriction structure is adapted to hold a ground line.

In one embodiment, the metal housing further includes at least one folded connection portion. The folded connection portion comprises a first section and a second section. The first section is connected to the bottom plate. The second section is connected to the first section and the first side plate. The first section overlaps with the second section. The folded connection portion is parallel to the bottom plate. The folded connection portion is perpendicular to the first side plate.

In one embodiment, the first side plate comprises a plurality of first bent portions. The first bent portions abut the third side plate and the fourth side plate. The second side plate comprises a plurality of second bent portions. The second bent portions abut the third side plate and the fourth side plate.

In one embodiment, the third side plate comprises a plurality of third bent portions. The third bent portions abut the first side plate and the second side plate, the fourth side plate comprises a plurality of fourth bent portions, and the fourth bent portions abut the first side plate and the second side plate.

In one embodiment, the restriction structure is a band structure.

In one embodiment, the band structure extends in a structural direction, and an included angle between the structural direction and a base line direction is between 30 degrees and 60 degrees. The base line direction extends perpendicular to the bottom plate.

In one embodiment, an electronic device is provided. The electronic device includes a circuit board and a metal housing. The circuit board comprises a first ground line. The metal housing comprises a bottom plate, a first side plate, a second side plate, a third side plate, a fourth side plate, and a first ground portion.

The second side plate is parallel to the first plate.

The fourth side plate is parallel to the third side plate. The first side plate, the second side plate, the third side plate and the fourth side plate are integrally formed on the bottom plate. The first ground portion is formed on a first inner surface of one of the side plates. The first ground portion comprises a restriction structure and an opening. The restriction structure is integrally formed on the first inner surface. The restriction structure is adapted to hold the first, ground line.

In one embodiment, the first ground line is connected to the circuit board at a first connection point. The first connection point is proximal to the first inner surface and corresponds to the first ground portion.

In one embodiment, the first ground line is connected to a first voltage area of the circuit board. The first ground portion is proximal to an edge of the first voltage area.

In one embodiment, the metal housing further comprises a second ground portion. The circuit board further comprises a second ground line. The second ground line is connected to a second voltage area of the circuit board. The second ground portion is formed on a second inner surface of one of the side plates and is proximal to an edge of the second voltage area. The first voltage area is a low-voltage area. The second voltage area is a high-voltage area.

In one embodiment, the first ground line does not extend to the second voltage area, and the second ground line does not extend to the first voltage area.

In one embodiment, the restriction structure comprises a structural width, the first ground line comprises a line diameter, and the ratio of the structural width to the line diameter is between 1:1 and 1:0.4.

In one embodiment, the restriction structure comprises at least one structural edge, the structural edge comprising a deckle edge and clamps the first ground line.

In one embodiment, in a clamping state, the greatest distance is formed between the restriction structure and the first inner surface, and the greatest distance is smaller than the line diameter.

Utilizing the metal housing and the electronic device of the embodiment of the invention, the metal housing is integrally formed, and the ground portion is integrally formed thereon by punching. The ground portion does not need to be welded to the metal housing. The manufacturing cost could be reduced & assembly process of the electronic device may be simplified.

BRIEF DESCRIPTION OF THE DRAWINGS

The present invention can be more fully understood by reading the subsequent detailed description and examples with references made to the accompanying drawings, wherein.

DESCRIPTION OF EMBODIMENTS

The following description describes a contemplated mode for carrying out the invention. The description is provided to illustrate the general principles of the invention and should not be taken in a limiting sense. The scope of the invention is best determined by reference to the appended claims.

Figure 1:
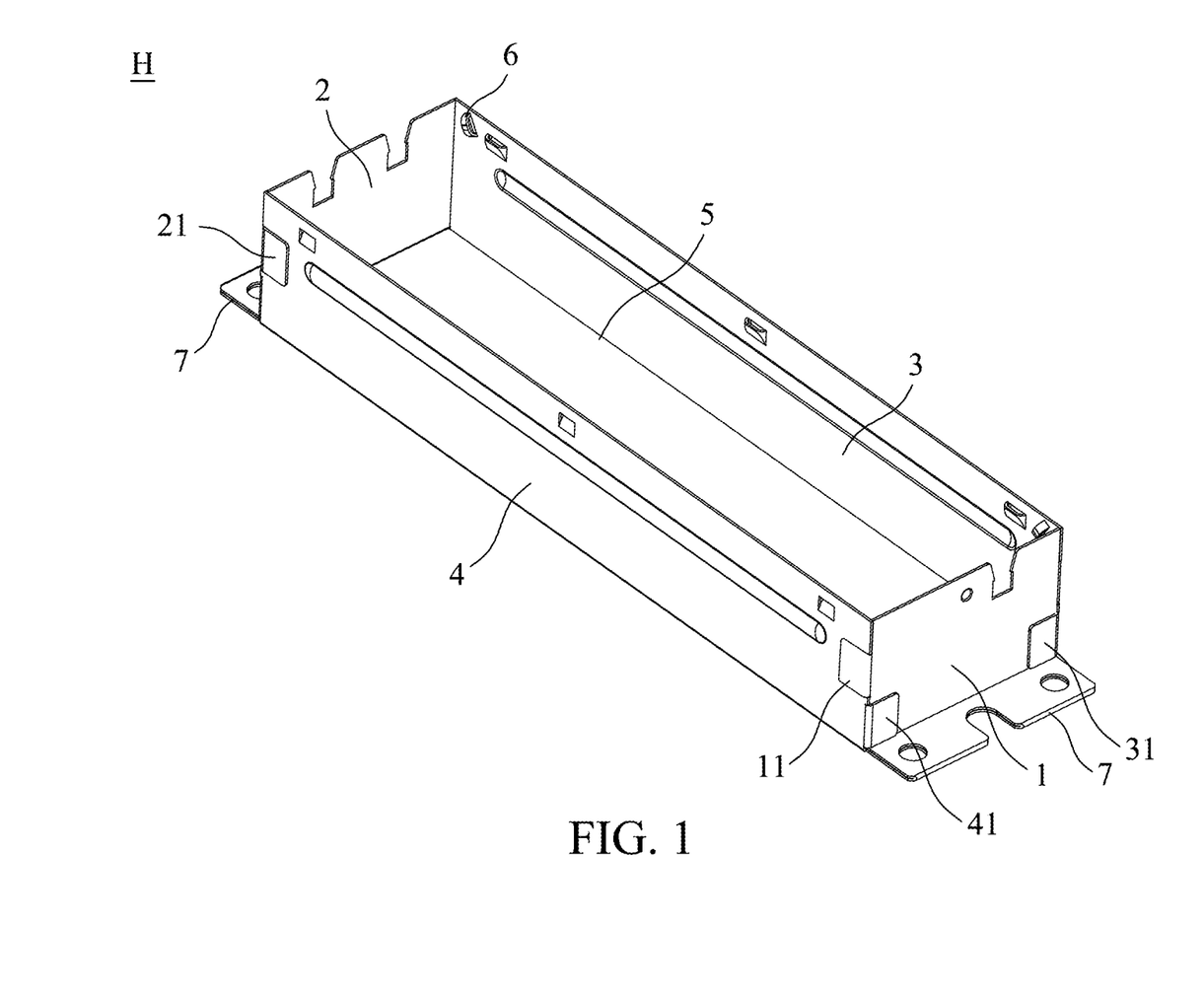
FIG. 1 is a perspective view of the metal housing of the embodiment of the invention.
Figure 2:
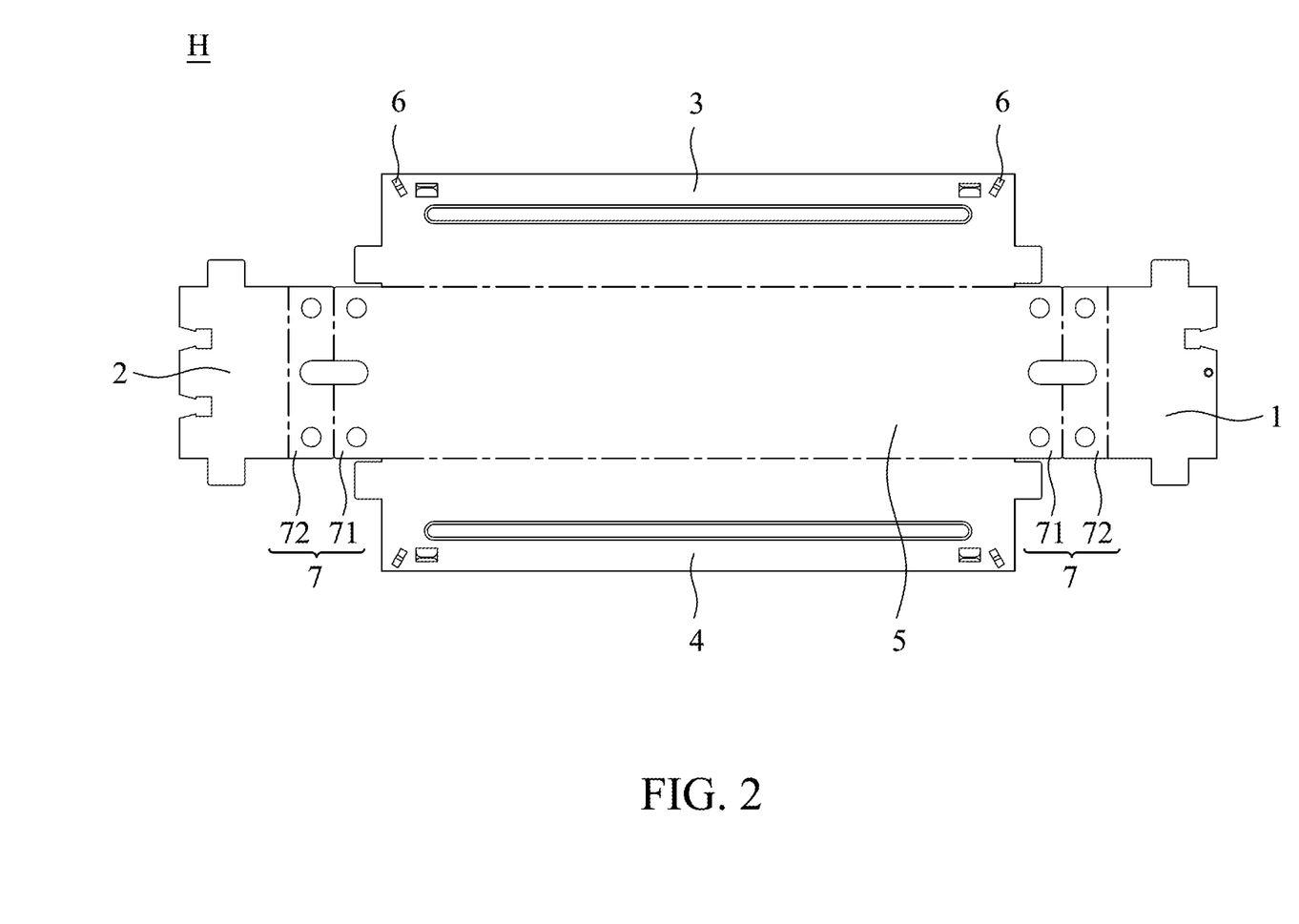
FIG. 2 shows the metal housing of the embodiment of the invention, wherein the metal housing is spread out.
Figure 3:
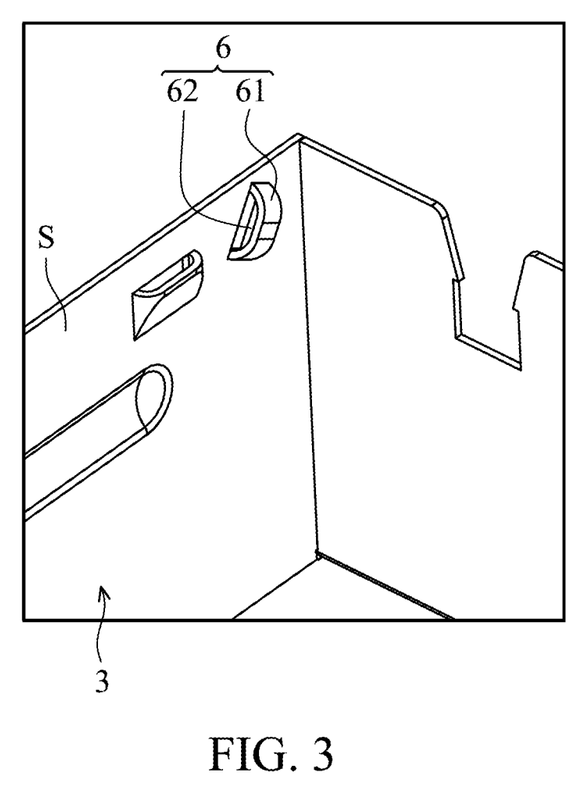
FIG. 3 shows the details of the ground portion of the embodiment of the invention.
Figure 4:
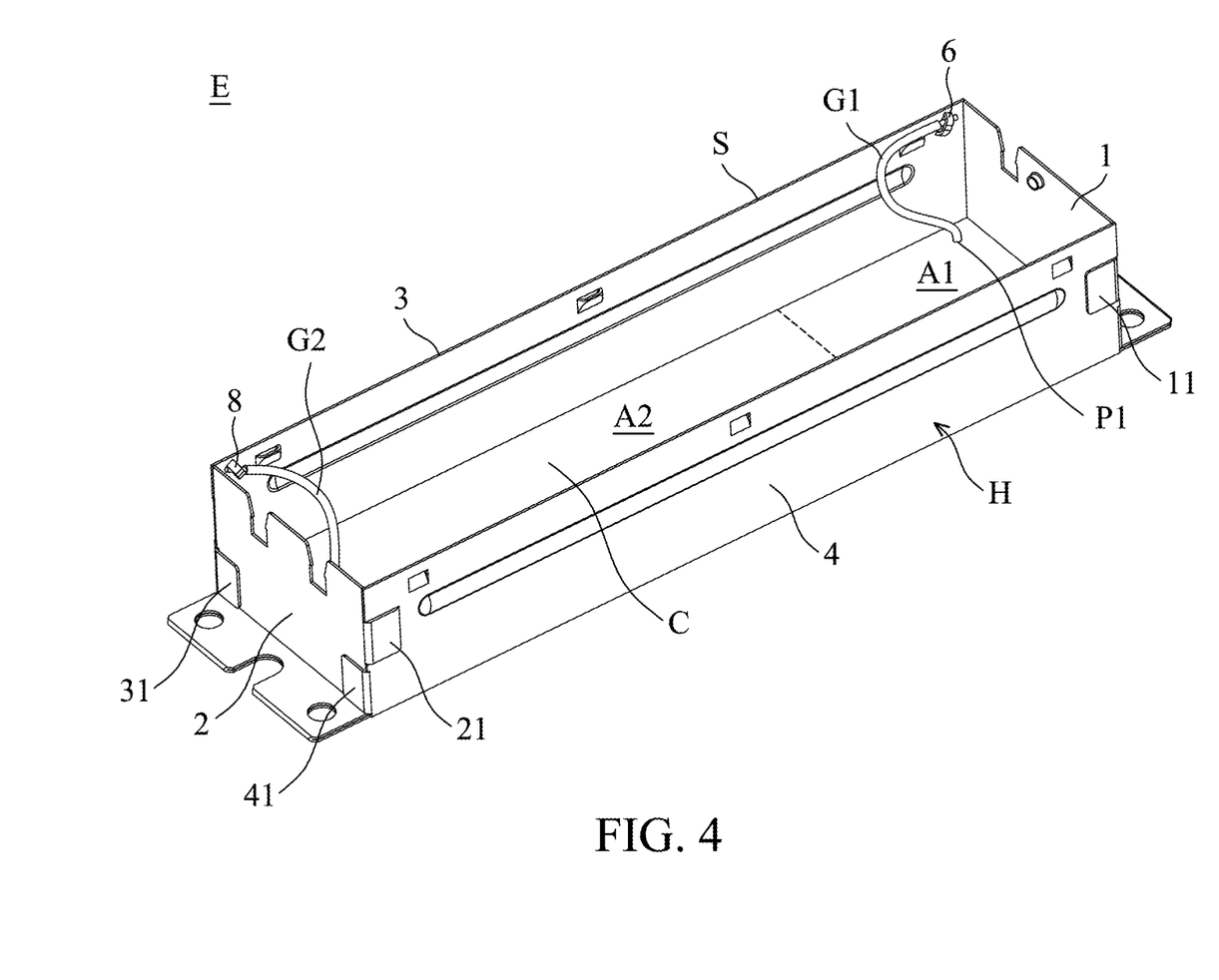
FIG. 4 shows the electronic device of the embodiment of the invention.

FIGS. 1 and 2 show a metal housing H according to an embodiment of the invention. The metal housing H includes a bottom plate 5, a first side plate 1, a second side plate 2, a third side plate 3, a fourth side plate 4 and a ground portion 6. The second side plate 2 is parallel to the first side plate 1. The fourth side plate 4 is parallel to the third side plate 3. The first side plate 1, the second side plate 2, the third side plate 3, and the fourth side plate 4 are integrally formed on the bottom plate 5. The around portion 6 is formed on an inner surface of one of the side plates. For example, with reference to FIGS. 1 and 3, in this embodiment, the ground portion 6 is formed on an inner surface S of the third side plate 3. The ground portion 6 includes a restriction structure 61 and an opening 62. The restriction structure 61 is integrally formed on the inner surface S. With reference to FIG. 4, the restriction structure 61 is adapted to hold (for example, to clamp) a ground line G1.

Utilizing the metal housing and the electronic device of the embodiment of the invention, the metal housing is integrally formed, and the ground portion is integrally formed thereon by punching. The ground portion is prevented from being welded to the metal housing. The manufacturing cost is reduced. The assembly process of the electronic device is simplified.

With reference to FIGS. 1 and 2, in one embodiment, the metal housing H further includes two folded connection portions 7. The folded connection portion 7 comprises a first section 71 and a second section 72. The first section 71 is connected to the bottom plate 5. The second section 72 is connected to the first section 71 and the first side plate 1. The first section 71 overlaps with the second section 72. The folded connection portion 7 is parallel to the bottom plate 5. The folded connection portion 7 is perpendicular to the first side plate 1. Similarly, on the other side (adjacent to the second side plate 2), the folded connection portion 7 is connected to the bottom plate 5 and the second side plate 2. Utilizing the folded connection portion 7 of the embodiment of the invention, the first side plate 1 tightly abuts the fourth side plate 4 and the third side plate 3, and the second side plate 2 tightly abuts the fourth side plate 4 and the third side plate 3, and the structural tightness of the metal housing H is improved.

With reference to FIGS. 1 and 4, in one embodiment, the first side plate 1 comprises a plurality of first bent portions 11. The first bent portions 11 abut the third side plate 3 and the fourth side plate 4. The second side plate 2 comprises a plurality of second bent portions 21. The second bent portions 21 abut the third side plate 3 and the fourth side plate 4. The third side plate 3 comprises a plurality of third bent portions 31. The third bent portions 31 abut the first side plate 1 and the second side plate 2. The fourth side plate 4 comprises a plurality of fourth bent portions 41, and the fourth bent portions 41 abut the first side plate 1 and the second side plate 2. The first bent portions 11, the second bent portions 21, the third bent portions 31, and the fourth bent portions 41 also improve the structural tightness of the metal housing H.

Figure 5:
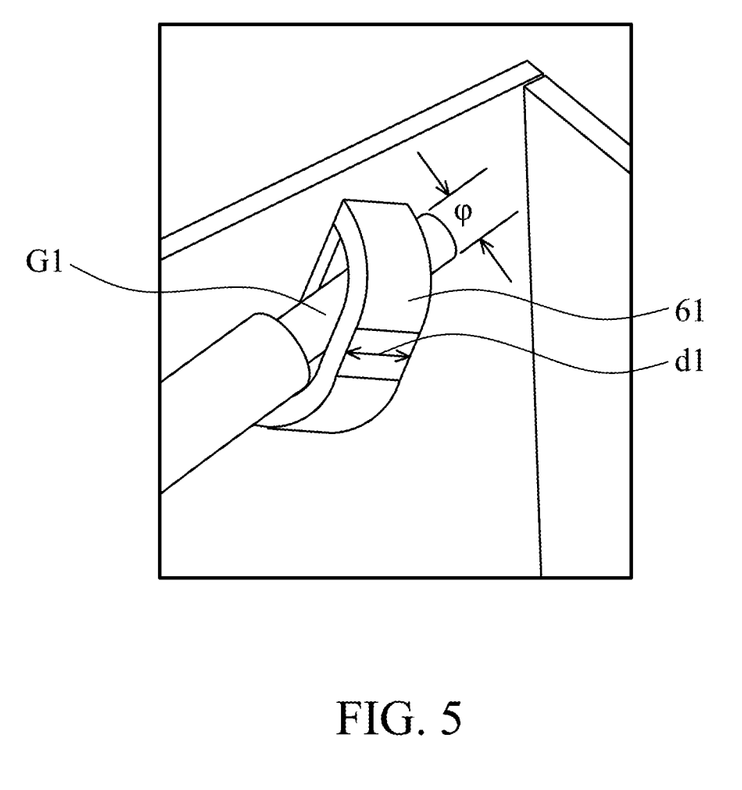
FIGS. 5 and 6 show the ground line inserted into the ground portion of the embodiment of the invention.

With reference to FIG. 5, the restriction structure 61 is a band structure. The band structure 61 extends in a structural direction X1. A base line L is perpendicular to the bottom plate 5. An included angle θ 1 between the structural direction X1 and the base line L is between 30 degrees and 60 degrees. Utilizing the design above, the ground line G1 can be inserted into the ground portion 6 at a desirable insertion angle. When assembled, the ground line G1 can be more easily inserted into the ground portion 6, and the ground line G1 is prevented from becoming separated from the ground portion 6.

With reference to FIG. 4, the metal housing H of the embodiment of the invention can be utilized in an electronic device E, such as a power supply unit. The electronic device E includes a circuit board C. The circuit board C comprises a first ground line G1 and a second ground line G2. The first ground portion 6 is formed on a first inner surface S of one of the side plates.

With reference to FIG. 4, in one embodiment, the first ground line G1 is connected to the circuit board C at a first connection point P1. The first connection point P1 is adjacent to the first inner surface S and corresponds to the first ground portion 6. Therefore, the electromagnetic interference caused by the first ground line G1 is prevented from affecting the electronic elements on the circuit board C. However, the disclosure is not meant to restrict the invention. To accommodate the design requirement of the circuit board C, in one embodiment, the location of the first ground portion 6 may be far away from the first connection point P1.

With reference to FIG. 4, in one embodiment, the first ground line G1 is connected to a first voltage area A1 of the circuit board C. The first ground portion 6 is near an edge of the first voltage area A1. The metal housing H further comprises a second ground portion 8. The second ground line G2 is connected to a second voltage area A2 of the circuit board C. The second ground portion 8 is formed on a second inner surface S of one of the side plates and is near an edge of the second voltage area A2. The first voltage area A1 is a low-voltage area. The second voltage area A2 is a high-voltage area. In this embodiment, the first inner surface and the second inner surface are located on the same side plate (the third side plate 3). However, the disclosure is not meant to restrict the invention. For example in another embodiment, the first inner surface and the second inner surface can respectively be located on two different side plates.

In one embodiment, the first ground line G1 does not extend to the second voltage area A2, and the second ground line G2 does not extend to the first voltage area A1. Therefore, the electromagnetic interference caused by the first ground line G1 and the second ground line G2 is prevented from affecting the electronic elements on the circuit board C.

With reference to FIG. 5, in one embodiment, the restriction structure 61 comprises a structural width dl, the first ground line G1 comprises a line diameter φ, and the ratio of the structural width dl to the line diameter φ is between 1:1 and 1:0.4. Therefore, the restriction structure 61 can sufficiently clamp the first ground line G1 to prevent the first ground line G1 from being separated.

Figure 6:
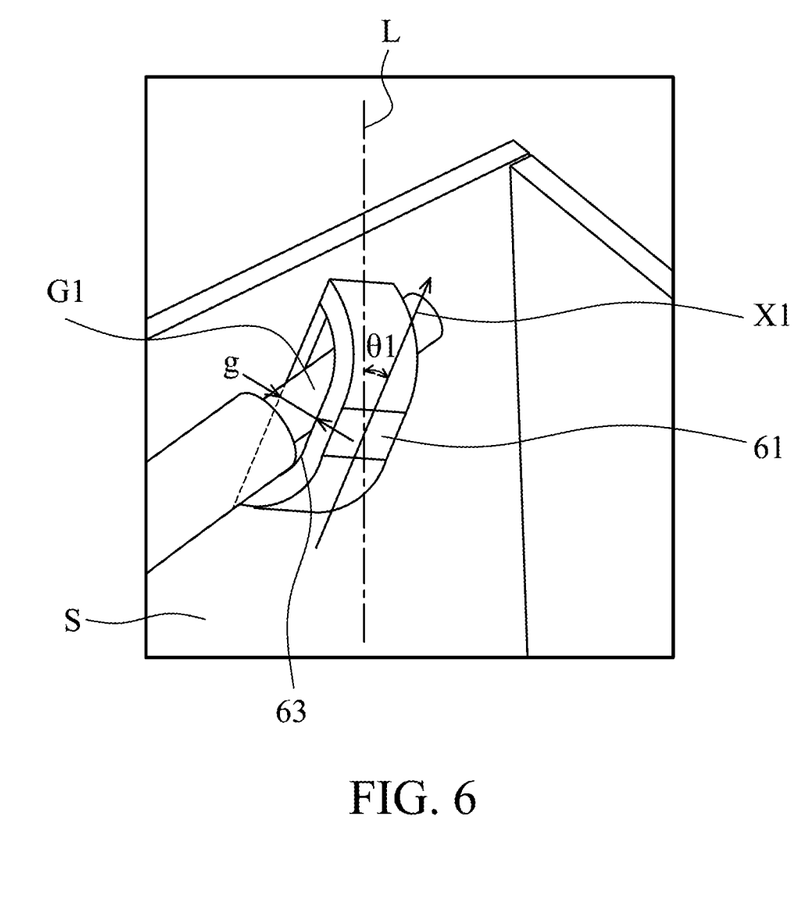

With reference to FIG. 6, in one embodiment, the restriction structure 61 comprises at least one structural edge 63. The structural edge 63 clamps the first ground line G1. The structural edge 63 comprises a deckle edge which improves the clamp capability to hold the first ground line G1 and to prevent the first ground line G1 from being separated.

With reference to FIGS. 5 and 6, in one embodiment, in a clamping state, the greatest distance g is formed between the restriction structure 61 and the first inner surface S. The greatest distance g is smaller than the line diameter φ. The restriction structure 61 therefore clamps the first ground line G1 to prevent the first ground line G1 from being separated.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A metal housing, comprising:
    a bottom plate;
    a first side plate;
    a second side plate, parallel to the first plate;
    a third side plate;
    a fourth side plate, parallel to the third side plate, wherein the first side plate, the second side plate, the third side plate and the fourth side plate are integrally formed on the bottom plate; and
    a ground portion, formed on an inner surface of one of the side plates, wherein the ground portion comprises a restriction structure and an opening configured to receive a ground line inserted into the opening in a direction parallel to the inner surface, and wherein the restriction structure is integrally formed on the inner surface, and the restriction structure is adapted to hold the ground line between the inner surface and the restriction structure.

2. The metal housing as claimed in claim 1, further comprising at least one folded connection portion, wherein the folded connection portion comprises a first section and a second section, the first section is connected to the bottom plate, the second section is connected to the first section and the first side plate, the first section overlaps with the second section, the folded connection portion is parallel to the bottom plate, and the folded connection portion is perpendicular to the first side plate.

3. The metal housing as claimed in claim 1, wherein the first side plate comprises a plurality of first bent portions, the first bent portions abut the third side plate and the fourth side plate, and wherein the second side plate comprises a plurality of second bent portions, the second bent portions abut the third side plate and the fourth side plate.

4. The metal housing as claimed in claim 3, wherein the third side plate comprises a plurality of third bent portions, the third bent portions abut the first side plate and the second side plate, and wherein the fourth side plate comprises a plurality of fourth bent portions, the fourth bent portions abut the first side plate and the second side plate.

5. The metal housing as claimed in claim 1, wherein the restriction structure is a band structure.

6. The metal housing as claimed in claim 5, wherein the band structure extends in a structural direction and an included angle between the structural direction and a base line direction is between 30 degrees and 60 degrees, and wherein the base line direction extends perpendicular to the bottom plate.

7. An electronic device, comprising:
    a circuit board, comprising a first ground line; and
    a metal housing, comprising:
        a bottom plate;
        a first side plate;
        a second side plate, parallel to the first plate;
        a third side plate;
        a fourth side plate, parallel to the third side plate, wherein the first side plate, the second side plate, the third side plate and the fourth side plate are integrally formed on the bottom plate; and
        a first ground portion, formed on a first inner surface of one of the side plates, wherein the first ground portion comprises a restriction structure and an opening configured to receive the first ground line inserted into the opening in a direction parallel to the first inner surface, and wherein the restriction structure is integrally formed on the first inner surface, and the restriction structure is adapted to hold the first ground line between the first inner surface and the restriction structure.

8. The electronic device as claimed in claim 7, wherein the first ground line is connected to the circuit board at a first connection point, and wherein the first connection point is proximal to the first inner surface and corresponds to the first ground portion.

9. The electronic device as claimed in claim 7, wherein the first ground line is connected to a first voltage area of the circuit board, and the first ground portion is proximal to an edge of the first voltage area.

10. The electronic device as claimed in claim 9, wherein the metal housing further comprises a second ground portion, wherein the circuit board further comprises a second ground line, the second ground line is connected to a second voltage area of the circuit board, wherein the second ground portion is formed on a second inner surface of one of the side plates and is proximal to an edge of the second voltage area, and wherein the first voltage area is a low-voltage area, and the second voltage area is a high-voltage area.

11. The electronic device as claimed in claim 10, wherein the first ground line does not extend to the second voltage area, and the second ground line does not extend to the first voltage area.

12. The electronic device as claimed in claim 7, wherein the restriction structure comprises a structural width, wherein the first ground line comprises a line diameter, and wherein a ratio of the structural width to the line diameter is between 1:1 and 1:0.4.

13. The electronic device as claimed in claim 7, wherein the restriction structure comprises at least one structural edge, the structural edge comprising a decide edge and clamps the first ground line.

14. The electronic device as claimed in claim 7, wherein in a clamping state, a greatest distance is formed between the restriction structure and the first inner surface, and wherein the greatest distance is smaller than the line diameter.

* * * * *